United States Patent
Chao

(10) Patent No.: US 8,968,529 B2
(45) Date of Patent: Mar. 3, 2015

(54) PRODUCTION METHOD FOR FORMING AN ANTIBACTERIAL FILM ON THE SURFACE OF AN OBJECT

(75) Inventor: Ming-Hsien Chao, Siansi Township, Changhua County (TW)

(73) Assignee: Ever Brite Technology Products Inc., Siansi Township, Changhua County (TW)

( * ) Notice: Subject to any disclaimer, the term of this patent is extended or adjusted under 35 U.S.C. 154(b) by 0 days.

(21) Appl. No.: 13/433,666

(22) Filed: Mar. 29, 2012

(65) Prior Publication Data

US 2013/0256120 A1    Oct. 3, 2013

(51) Int. Cl.
   *C23C 14/14*    (2006.01)
(52) U.S. Cl.
   USPC ............. 204/192.38; 204/298.26; 204/298.41
(58) Field of Classification Search
   USPC .......................... 204/192.38, 298.41, 298.26
   See application file for complete search history.

(56) References Cited

U.S. PATENT DOCUMENTS

| | | | | |
|---|---|---|---|---|
| 4,877,505 A | * | 10/1989 | Bergmann | ............... 204/192.38 |
| 6,641,703 B2 | * | 11/2003 | Nomura et al. | .......... 204/192.12 |
| 2005/0202099 A1 | * | 9/2005 | Lo | .................................. 424/617 |
| 2008/0189952 A1 | * | 8/2008 | Everett et al. | .................. 30/43.4 |

* cited by examiner

*Primary Examiner* — Jason M Berman
(74) *Attorney, Agent, or Firm* — Egbert Law Offices, PLLC

(57) ABSTRACT

A production method combining cathode arc and magnetron sputtering methods to form an antibacterial film on the surface of an object. Inside the vacuum chamber, both a cathode arc target source and a magnetron sputtering target source are configured. On the cathode arc target source, at least one of a zirconium, titanium, or chromium target is installed. On the magnetron sputtering target source, a silver target is installed. Argon and nitrogen are filled into the vacuum chamber to respectively ionize the silver target and one of the zirconium target, titanium target, or chromium target. Remote control is used to adjust the ionization proportion between one of the zirconium, titanium, or chromium target and the silver target to be 90-99%:1-9%. The surface of the object is formed with one of the zirconium nitride-silver mixed antibacterial film, titanium nitride-silver mixed antibacterial film, or chromium nitride-silver mixed antibacterial film.

3 Claims, 4 Drawing Sheets

Configure both cathode arc target source and magnetron sputtering target source inside the vacuum chamber.

Configure both cathodic electrode on the cathode arc target source, and install at least one of zirconium target, titanium target, or chromium target on the cathode arc target source.

Install at least one of zirconium target, titanium target, or chromium target on the cathode arc target source.

Install silver target on the magnetron sputtering target source.

Fill argon and nitrogen into the vacuum chamber, to respectively ionize the silver target and one of the zirconium target, titanium target, or chromium target.

Through remote control, make the ionization proportion between one of the zirconium target, titanium target, or chromium target and the silver target as 90 to 99%: 1-9%,

Form one of zirconium nitride -silver mixed antibacterial film, titanium nitride -silver mixed antibacterial film, or chromium nitride -silver mixed antibacterial film on the surface of the object.

FIG.2

PRODUCTION METHOD FOR FORMING AN ANTIBACTERIAL FILM ON THE SURFACE OF AN OBJECT

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates generally to a production method to form an antibacterial film on the surface of an object, and more particularly to an innovative one combining cathode arc method and magnetron sputtering method.

2. Description of Related Art Including Information Disclosed Under 37 CFR 1.97 and 37 CFR 1.98

Based on currently known technologies in the coating industry, to provide both antibacterial and aesthetic effect on the surface of an object, a decorative film can be formed initially on the surface of the object. However, as this decorative film is only for the demand of aesthetic effect, it usually does not have antibacterial property. In such cases, it is usually necessary to further form an antibacterial film over the decorative film. To reflect the aesthetic effect of the decorative film, the antibacterial coating must have transparency. However, the limited transparency of the antibacterial film may still damage the aesthetic effect of the decorative film, and the antibacterial coating may be easily worn and will lose its antibacterial effect. Therefore, it is truly necessary to provide an innovative antibacterial film as a break-through technology to overcome the above problems.

If physical vacuum vapor deposition is adopted to form the antibacterial film, the problems relating to the above known coating method can be solved. Methods of physical vacuum vapor deposition mainly include thermal evaporation, magnetron sputtering, hollow cathode evaporation, cathode arc vapor deposition, and electron-beam evaporation etc; and coating objects cover metals, ceramics, plastics, textiles, glass etc. Therefore, there is a wide scope of application.

Each of the physical vacuum vapor deposition methods described above has their respective advantages and disadvantages in actual application. For example, comparing to magnetron sputtering method, cathode arc vapor deposition method features higher forming speed, but the coating surface is coarse and has the shortcomings of imperfect fineness and evenness. While magnetron sputtering method can offer even coating and high density, but the forming efficiency is lower than cathode arc vapor deposition method.

Thus, to overcome the aforementioned problems of the prior art, it would be an advancement if the art to provide an improved structure that can significantly improve the efficacy.

Therefore, the inventor has provided the present invention of practicability after deliberate design and evaluation based on years of experience in the production, development and design of related products.

BRIEF SUMMARY OF THE INVENTION

The production method combining cathode arc method and magnetron sputtering method to form an antibacterial film on the surface of an object disclosed in the present invention is mainly characterized by the configuration of a cathode arc target source and a magnetron sputtering target source inside the vacuum chamber of the vacuum coating equipment, and the installation of a zirconium target, titanium target or chromium target on the cathode arc target source, and a silver target on the magnetron sputtering target source to go with the ionization process of argon and nitrogen. Comparing to the prior art, the present invention can take advantage of the high forming speed of the cathode arc vapor deposition method, so that the object can be quickly coated with one of zirconium nitride, titanium nitride, or chromium nitride which accounts for a higher percentage in the antibacterial film. On the other hand, due to the even filming and high density coating of the magnetron sputtering method, the silver ions can be evenly and delicately distributed on the various areas of the antibacterial film to fill up the fine pores of the above coarse film. Hence, the present invention can provide both high production efficiency and good coating quality. The practical advancement is obvious.

Although the invention has been explained in relation to its preferred embodiment, it is to be understood that many other possible modifications and variations can be made without departing from the spirit and scope of the invention as hereinafter claimed.

BRIEF DESCRIPTION OF THE SEVERAL VIEWS OF THE DRAWINGS

FIG. 2 is a production process chart of the present invention combining cathode arc method with magnetron sputtering method to form an antibacterial film on the surface of the object.

DETAILED DESCRIPTION OF THE INVENTION

Figure 1:
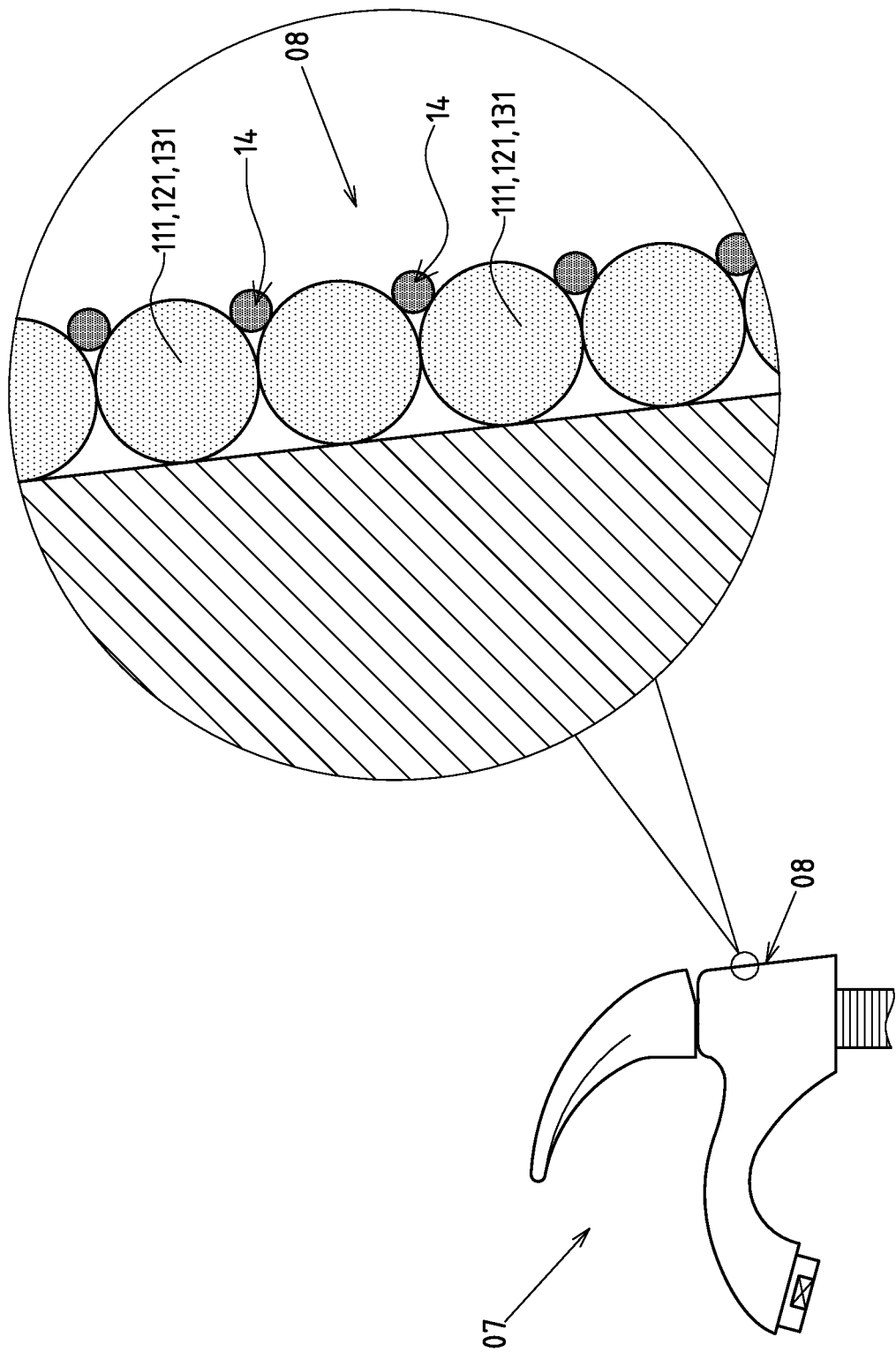
FIG. 1 is a partially enlarged view of the object in the embodiment of the present invention formed with a mixed antibacterial film.

The detailed production process of cathode arc vapor deposition method and magnetron sputtering method mentioned in the content of this embodiment are described below with the following example.

FIGS. 1 to 4 show the production method of the present invention combining cathode arc method and magnetron sputtering method to form an antibacterial film on the surface of an object. However, such an embodiment is illustrative only and is not intending to limit the scope of patent application. Said production method is carried out inside the vacuum chamber 06 of a set of vacuum coating equipment 05, to form an antibacterial film 08 (only marked in FIG. 1) over the surface of the object 07 placed inside the vacuum chamber 06. The production method includes the following steps:

1. Inside the vacuum chamber 06, both cathode arc target source 10 and magnetron sputtering target source 20 are configured;

2. On the cathode arc target source 10, install at least one of zirconium target 11, titanium target 12, or chromium target 13;

3. On the magnetron sputtering target source 20, install silver target 21;

4. Fill argon and nitrogen (as L1, L2 marked in FIG. 4) into the vacuum chamber 06, to respectively ionize the silver target 21 and one of the zirconium target 11, titanium target 12, or chromium target 13;

5. Through remote control, make the ionization proportion between one of the zirconium target 11, titanium target 12, or chromium target 13 and the silver target 21 as follows:
   zirconium nitride 111:silver 14=90-99%:1-9%,
   titanium nitride 121:silver 14=90-99%:1-9%,
   chromium nitride 131:silver 14=90-99%:1-9%;

6. After completion, on the surface of the object 07, one of zirconium nitride 111-silver 14 mixed antibacterial film 08, titanium nitride 121-silver 14 mixed antibacterial film 08, or chromium nitride 131-silver 14 mixed antibacterial film 08 is formed (only marked in FIG. 1).

As described above, said cathode arc method (also called vacuum arc method) is one of existing physical vacuum vapor deposition methods. It is mainly a coating technology to apply vacuum arc light discharge on the evaporation source to release and emit the vapor particles of the target material from the surface of the cathode target. Most of the vapor particles will become ions and droplets. Ions are the most important element in the production method, the ionized vapor of the target material is accelerated by the negative bias relative to the vacuum chamber and the anode, and collides with and deposits on the substrate. On the other hand, the magnetron sputtering method is based on the ion sputtering principle. When energetic particles attack the solid surface, atoms and molecules will exchange motion energy with the energetic particles and fly out from the solid surface. Such a phenomenon is called "sputtering". Firstly, an electric field is applied to generate electrons between the two electrodes. The accelerated electrons will collide with the inert gases pre-filled into the coating chamber to make them positively charged. The positively charged particles will be attracted by the cathode (target material) and collide with the cathode. The incident ions (usually argon is used) acquire motion energy under the influence of the electric field, and collide with the atoms on the surface of the target material. After the collision, these atoms obtain the momentum transferred from the incident ions, and with the momentum acquired from the incident ions, the impacted atoms on the surface of the target material will squeeze the atoms under the surface and make them move. The squeeze of multiple layers of atoms under the surface of the target material will generate an acting force perpendicular to the surface of the target material and knock out the atoms on the surface. The knocked-out atoms will finally deposit on the substrate (anode) to form a thin film.

Meanwhile, the color of the antibacterial film 08 will have the following results based on different cathode arc target sources 10 adopted in the production process:

1. Zirconium nitride 111-silver 14 is in the color of bronze or stainless steel;
2. Titanium nitride 121-silver 14 is in the color of gold or stainless steel;
3. Chromium nitride 131-silver 14 is in the color of chromium.

Figure 3:
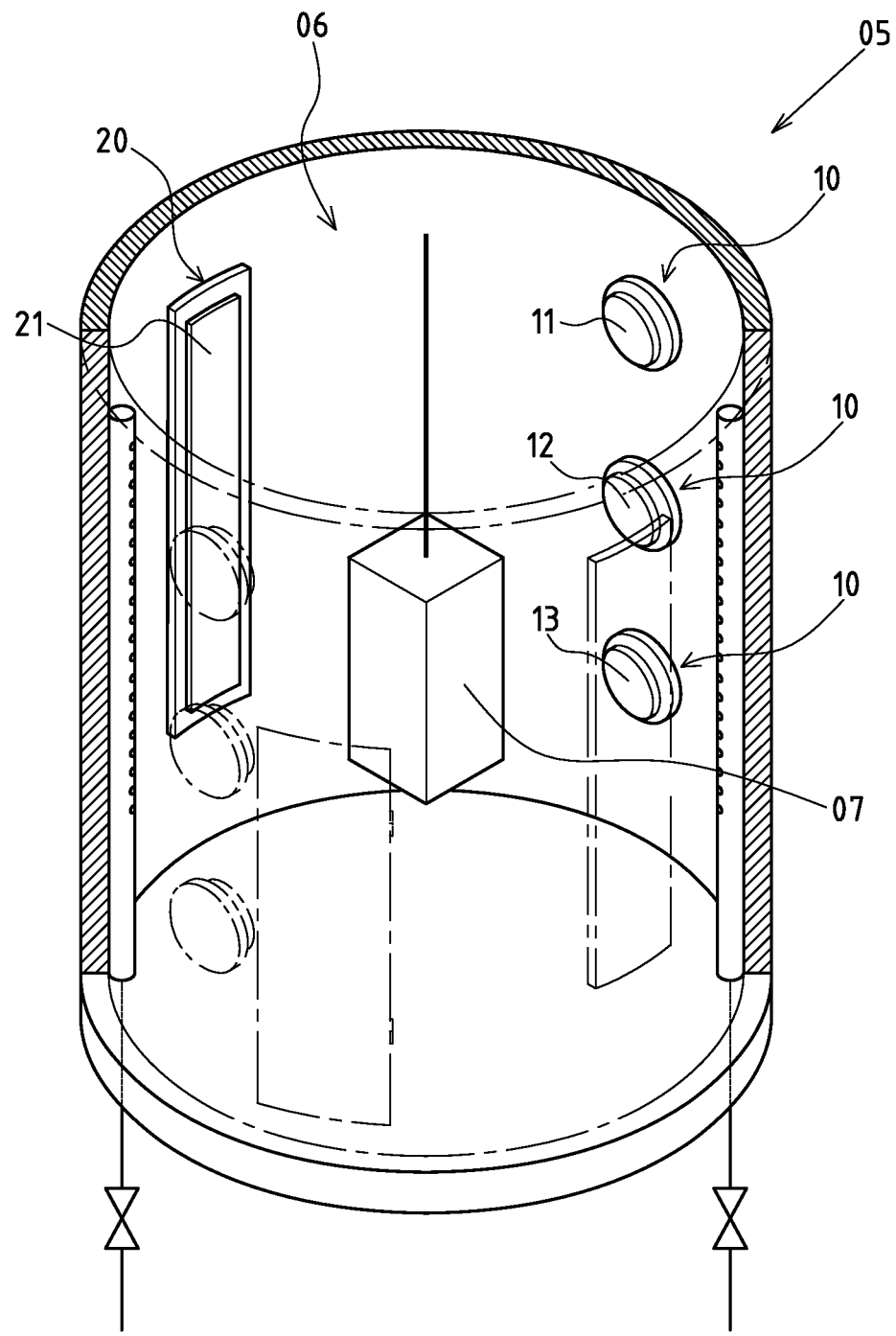
FIG. 3 is a perspective view of the object of the present invention hung on the vacuum coating equipment.
Figure 4:
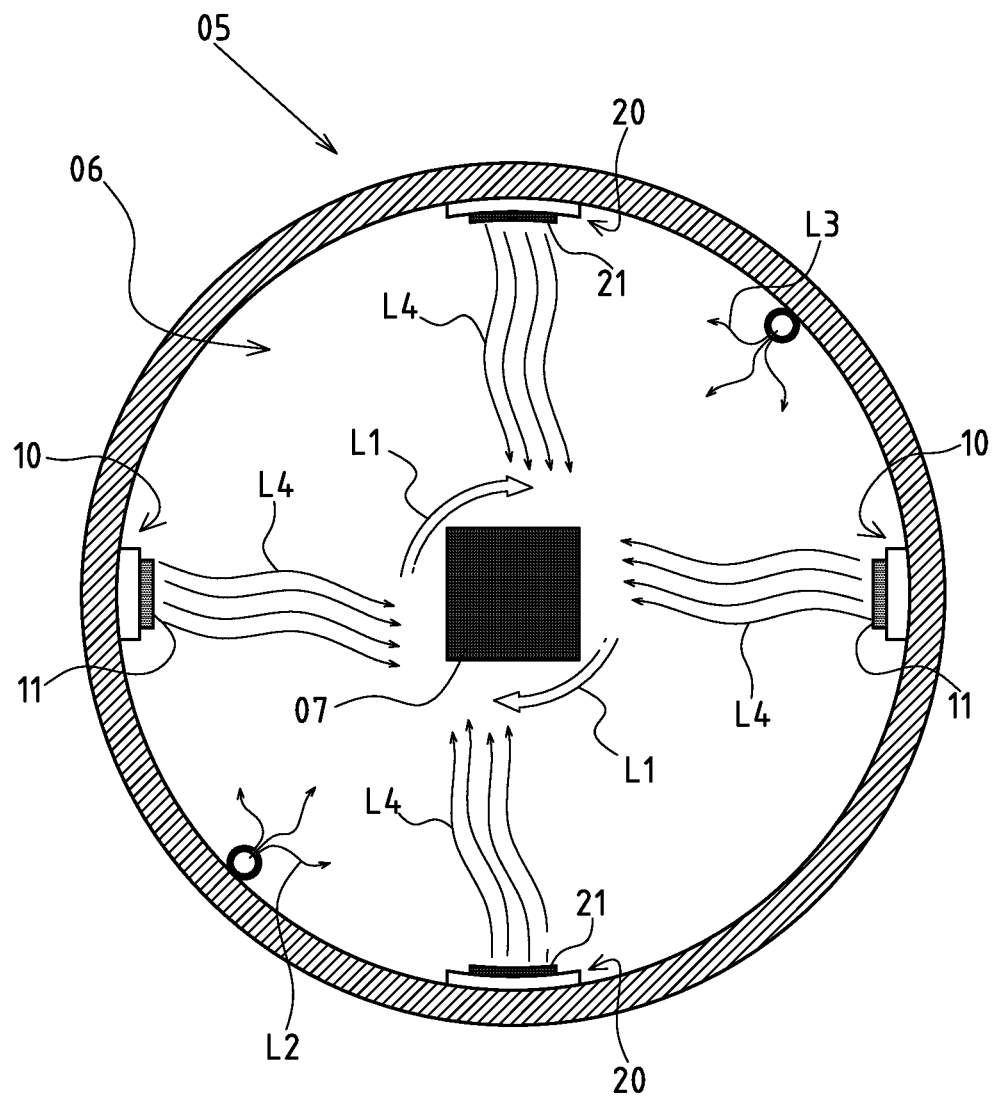
FIG. 4 is a state view of the present invention of the coating process inside the vacuum chamber (note: reflected in a plane bird view).

FIGS. 3 and 4 provide further details of the above production method. Firstly, cathode arc target source 10 and magnetron sputtering target source 20 are installed in the vacuum chamber 06 of the vacuum coating equipment 05. On the cathode arc target source 10, the three of zirconium target 11, titanium target 12, and chromium target 13 can be installed at the same time, and an on-off control mechanism can be used to select and open one of them as the target source for ionization. Here, as an example for description purpose, zirconium target 11 is selected as the target source for ionization. Firstly, the operator hangs the object 07 (object to be coated) on a revolving driven device (omitted in the drawing) preset inside the vacuum chamber 06 of the vacuum coating equipment 05, so that the object 07 can automatically rotate during the coating process (as indicated by Arrow L1 in FIG. 4). Then, fill the vacuum chamber 06 with argon and nitrogen (as indicated by Arrows L2 and L3 in FIG. 4), so as to ionize the silver target 21 and the zirconium target 11. During this process, remote control is used to adjust the proportion of ionization between the zirconium target 11 and the silver target 21 to be 90-99%:1-9%. Through this ionization process, the ions released from the silver target 21 and the zirconium target 11 (as indicated by Arrow L4 in FIG. 4) will drift and attach to the surface of the object 07 to form the film. By now, the surface of the object 07 will form a zirconium nitride 111-silver 14 mixed antibacterial film 08.

It is to be noted that, in actual application, the object 07 mentioned in the present invention can widely include medical products, sanitary products, furniture, decorative products, lock and hardware products, hand tool products, clocks and glasses etc. Through the above-mentioned coating process, the product surface can form a mixed antibacterial film 08. FIG. 1 shows an implementation example wherein the surface of bathtub water tap is formed with an antibacterial film 08.

I claim:

1. A method of forming an antibacterial film on a surface of an object, the method comprising:
   configuring both a cathode target source and a magnetron sputtering target source within a vacuum chamber;
   installing at least one of a zirconium target, a titanium target and a chromium target onto the cathode target source;
   installing a silver target onto the magnetron sputtering target source;
   filling the vacuum chamber with argon and nitrogen so as to respectively ionize the silver target and one of the zirconium target, the titanium target and the chromium target;
   remotely controlling an ionization proportions between one of the zirconium target, the titanium target and the silver target in the proportions of:
   zirconium nitride:silver=90-99%:1-9%,
   titanium nitride:silver=90-99%:1-9%,
   chromium nitride:silver=90-99%:1-9%; and
   forming on the surface of the object a film selected from one of zirconium nitride-silver film, titanium nitride-silver film and chromium-silver film.

2. The method of claim 1, the object selected from the group consisting of medical products, sanitary products, furniture, decorative products, lock, hardware, hand tools, clocks and glasses.

3. The method of claim 1, the step of installing comprising:
   installing the zirconium target and the titanium target and the chromium target at the same time;

selectively opening one of the zirconium target and the titanium target and the chromium target with an on-off control mechanism.

\* \* \* \* \*